(12) United States Patent
Liang et al.

(10) Patent No.: US 7,285,454 B1
(45) Date of Patent: Oct. 23, 2007

(54) BIPOLAR TRANSISTORS WITH LOW BASE RESISTANCE FOR CMOS INTEGRATED CIRCUITS

(75) Inventors: Minchang Liang, Santa Clara, CA (US); Yow-Juang Liu, San Jose, CA (US); Fangyun Richter, San Jose, CA (US)

(73) Assignee: Altera Corporation, San Jose, CA (US)

( * ) Notice: Subject to any disclaimer, the term of this patent is extended or adjusted under 35 U.S.C. 154(b) by 153 days.

(21) Appl. No.: 11/207,461

(22) Filed: Aug. 19, 2005

Related U.S. Application Data

(62) Division of application No. 10/784,417, filed on Feb. 23, 2004, now Pat. No. 6,972,466.

(51) Int. Cl.
*H01L 21/8238* (2006.01)

(52) U.S. Cl. .............. 438/202; 438/204; 438/205; 257/E27.015

(58) Field of Classification Search ........ 438/188–342; 257/E27.015
See application file for complete search history.

(56) References Cited

U.S. PATENT DOCUMENTS

| | | | |
|---|---|---|---|
| 5,001,073 A | 3/1991 | Huie | |
| 5,011,784 A | 4/1991 | Ratnakumar | |
| 5,179,036 A | 1/1993 | Matsumoto | |
| 5,245,209 A | 9/1993 | Ishigaki | |
| 5,286,986 A | 2/1994 | Kihara et al. | |
| 5,298,440 A * | 3/1994 | Jerome et al. | 438/339 |
| 5,336,926 A | 8/1994 | Matthews | |
| 5,399,894 A | 3/1995 | Maeda et al. | |
| 5,471,083 A | 11/1995 | Ikeda et al. | |
| 5,504,364 A | 4/1996 | Chang et al. | |
| 6,208,010 B1 | 3/2001 | Nakazato et al. | |
| 6,246,104 B1 * | 6/2001 | Tsuda et al. | 257/558 |
| 6,365,932 B1 | 4/2002 | Kouno et al. | |
| 6,392,275 B1 | 5/2002 | Jang | |
| 6,803,634 B2 | 10/2004 | Okuno et al. | |
| 2002/0048873 A1 | 4/2002 | Arai | |
| 2003/0104658 A1 | 6/2003 | Furukawa et al. | |

OTHER PUBLICATIONS

A. Hokazono et al. "Source/Drain Engineering for Sub-100 nm CMOS Using Selective Epitaxial Growth Technique" (c) 2000 IEEE.

(Continued)

*Primary Examiner*—H. Jey Tsai
(74) *Attorney, Agent, or Firm*—G. Victor Treyz

(57) ABSTRACT

Complementary metal-oxide-semiconductor (CMOS) integrated circuits with bipolar transistors and methods for fabrication are provided. A bipolar transistor may have a lightly-doped base region. To reduce the resistance associated with making electrical contact to the lightly-doped base region, a low-resistance current path into the base region may be provided. The low-resistance current path may be provided by a base conductor formed from heavily-doped epitaxial crystalline semiconductor. Metal-oxide-semiconductor (MOS) transistors with narrow gates may be formed on the same substrate as bipolar transistors. The MOS gates may be formed using a self-aligned process in which a patterned gate conductor layer serves as both an implantation mask and as a gate conductor. A base masking layer that is separate from the patterned gate conductor layer may be used as an implantation mask for defining the lightly-doped base region.

18 Claims, 13 Drawing Sheets

OTHER PUBLICATIONS

A. Samoilov et al. "Properties and Applications of Strained Si/SiGe", Applied Materials Inc., Apr. 17, 2002.

J. Zhang. et al.n-Si/i-p-i SiGe/n-Si structure for SiGe microwave power heterojunction bipolar transistor grown by ultra-high-vacuum chemical molecular epitaxy Journal of Applied Physics, vol. 86, No. 3, pp. 1463-1466, Aug. 1, 1999 (c) American Institute of Physics.

M. Kumar, "A 3-D BiCMOS Technology Using Selective Epitaxial Growth (SEG) and Lateral Solid Phase Epitaxy (LSPE)", 2001 IEEE.

J.-M. Hartmann, "Reduced Pressure—Chemical Vapor Deposition of Si/SiGeC heterostructures for future applications". CEA/LETI Annual Review 2002.

R. Chau, "Advanced Depleted-Substrate Transistors: Single-Gate, Double-Gate and Tri-Gate", 2002 International Conference on Solid State Devices and Materials (SSDM 2002), Nagoya, Japan Sep. 17, 2002.

Z. Krivokapic, "High Performance 25 nm FDSOI Devices with Extremely Thin Silicon Channel" AMD, Technology Research Group (Jun. 2003).

* cited by examiner

BIPOLAR TRANSISTORS WITH LOW BASE RESISTANCE FOR CMOS INTEGRATED CIRCUITS

This application is a division of patent application Ser. No. 10/784,417, filed Feb. 23, 2004, now U.S. Pat. No. 6,972,466 which is hereby incorporated by reference herein in its entirety.

BACKGROUND OF THE INVENTION

This invention relates to bipolar transistors and methods for fabricating bipolar transistors, and, more particularly, to bipolar transistors with low base resistances formed on complementary metal-oxide-semiconductor (CMOS) integrated circuits.

Integrated circuits based on complementary metal-oxide-semiconductor (CMOS) transistors contain complementary n-channel and p-channel metal-oxide-semiconductor (MOS) field-effect transistors. CMOS technology allows circuits to be formed that exhibit low power consumption and high levels of integration.

It is sometimes desirable to form another type of transistor——called the bipolar junction transistor (BJT) on the same silicon substrate as the MOS transistors in a CMOS integrated circuit. Bipolar junction transistors can be used to form circuits that are difficult or impractical to form using MOS transistors.

Fabricating both bipolar transistors and MOS transistors as part of the same integrated circuit is challenging and the bipolar transistors that result generally do not exhibit optimal performance. One obstacle to forming high-performance bipolar transistors on CMOS integrated circuits relates to the presence of an oxide layer that is used in the gates of the MOS transistors.

The MOS transistors in CMOS circuits have three electrodes—a source, a drain, and a gate. Signals pass between the source and drain under the control of signals applied to the gate. The gate of an MOS transistor has a gate conductor that is separated from an underlying silicon channel region by a thin gate oxide. The gate oxide is an insulator and does not conduct current.

Bipolar transistors also have three electrodes—an emitter, a collector, and a base. The emitter and collector of a bipolar transistor are roughly analogous to the source and drain in an MOS transistor. A bipolar base is analogous to an MOS gate.

It is generally desirable to form bipolar transistors and MOS transistors that have small lateral dimensions (i.e., small base widths and small gate lengths). With conventional approaches for forming. bipolar transistors on CMOS circuits, these small lateral dimensions are defined by forming narrow polysilicon lines over a thin gate oxide layer.

These conventional approaches result in CMOS devices that are optimal, but bipolar devices that have undesirably high base resistances. In the CMOS portion of the circuit, the narrow polysilicon lines are used as gate conductors. The thin oxide under each polysilicon line is used as the gate oxide. In the bipolar portion of the circuit, the narrow polysilicon lines help to define the bases during fabrication. However, the underlying gate oxide blocks access to the silicon of the base, which makes it difficult to form a low-resistance connection. High base resistances cause bipolar performance to suffer.

It is an object of the present invention to provide bipolar transistors with low base resistances on CMOS integrated circuits.

SUMMARY OF THE INVENTION

In accordance with the present invention, bipolar transistors are formed on complementary-metal-oxide-semiconductor (CMOS) integrated circuits. The CMOS integrated circuits have circuitry formed from n-channel and p-channel metal-oxide-semiconductor (MOS) field-effect transistors. The MOS transistors have drains, sources, and gates. Each gate has a gate conductor and a gate oxide. The gate oxide separates the gate conductor from the semiconductor substrate of the integrated circuit. The bipolar transistors that are formed on the CMOS integrated circuits have emitters, collectors and bases. The bipolar transistors and MOS transistors are formed on the integrated circuits using a series of process steps that are able to produce both bipolar and MOS structures on the same semiconductor substrate.

The source and drain of each MOS transistor are separated by a corresponding gate. The distance between the source and drain is referred to as the gate length. The gate lengths of most MOS transistors are much shorter than their widths. Narrow gate lengths are generally desired to produce high-performance MOS transistors. A typical gate length is about 0.1 microns.

The emitter and collector of each bipolar junction transistor are separated by a corresponding base. The distance separating the emitter from the collector in a bipolar transistor is referred to as the base width. The base widths in bipolar transistors are generally much shorter than their lengths. Base widths for high-performance bipolar junction transistors may be about 0.1 microns.

Masking layers are used to define the narrow bases and narrow gates. The narrow gates of the MOS transistors are defined using a masking layer that contains narrow gate conductor lines. A self-aligned gate fabrication process is used. With this technique, the gate conductor lines are used both as an ion-implantation mask during drain/source doping and as gate conductors. The gate conductor lines are typically metal or doped polysilicon covered with a silicide layer to reduce their resistance.

The narrow bases of the bipolar transistors are defined by a base masking layer ion implantation mask that is separate from the gate conductor masking layer used to define the narrow gates of the MOS transistors. The base masking layer may be formed from a patterned epitaxial silicon-germanium layer. The same ion implantation process is used to form both emitters and collectors for the bipolar junction transistors and sources and drains for the MOS transistors. During ion implantation, narrow lines in the base masking layer define narrow-width lightly-doped base regions that separate the emitters and collectors.

Following ion implantation, the base masking layer is removed. Epitaxial growth may be used to increase the thickness of the sources, drains, collectors and emitters. During this growth process, a heavily-doped epitaxial semiconductor base conductor is formed directly on top of each lightly-doped bipolar transistor base region. Each heavily-doped base conductor may extend along the entire length of its associated base region. Because of the use of a base masking layer to define the base regions that is separated from the gate conductor masking layer used to form the MOS transistors gates, no oxide from the gate oxide layer lies between the base conductors and the underlying base regions. The base conductors therefore form low-resistance parallel current paths into the active base regions of the bipolar transistors. This reduces base resistance and improves bipolar performance.

Further features of the invention, its nature and various advantages will be more apparent from the accompanying drawings and the following detailed description of the preferred embodiments.

BRIEF DESCRIPTION OF THE DRAWINGS

FIG. 6 is a cross-sectional side view that shows formation of a base masking layer in accordance with the present invention.

FIG. 7 is a cross-sectional side view that shows formation of a gate oxide and gate conductor in accordance with the present invention.

FIG. 8 is a cross-sectional side view that shows how a spacer layer can be formed in accordance with the present invention.

FIG. 9 is a cross-sectional side view that shows how the spacer layer of FIG. 6 can be etched to form a spacer in accordance with the present invention.

FIG. 10 is a cross-sectional side view that shows how the base masking layer can be removed without damaging exposed gate structures on the circuit in accordance with the present invention.

FIG. 11 is a cross-sectional side view that shows how a first epitaxial mask may be formed and how a first corresponding epitaxial layer may be grown on the integrated circuit in accordance with the present invention.

FIG. 12 is a cross-sectional side view that shows how a second epitaxial mask may be formed and how a second corresponding epitaxial layer may be grown on the integrated circuit in accordance with the present invention.

FIG. 13 is a cross-sectional side view that shows how a silicide layer may be patterned onto the circuit after the second epitaxial mask has been removed in accordance with the present invention.

DETAILED DESCRIPTION OF THE PREFERRED EMBODIMENTS

The present invention relates to integrated circuits having complementary metal-oxide-semiconductor (CMOS) field-effect transistors and bipolar junction transistors (BJTs). The invention also relates to methods for fabricating such integrated circuits.

It is often desirable to form bipolar transistors on a CMOS integrated circuit. Bipolar transistor structures can be used to form silicon-controlled rectifiers (SCRs) for electrostatic discharge (ESD) protection circuits. Bipolar transistor structures can also be used in temperature-invariant voltage reference circuits and as part of integrated bipolar-CMOS (BiCMOS) designs.

The process technology used for fabricating CMOS integrated circuits is optimized for forming metal-oxide-semiconductors (MOS) transistor structures, not bipolar transistors. This results in less-than-optimum performance for the bipolar transistor structures formed on CMOS integrated circuits.

One impediment to optimum bipolar transistor performance is the high base resistance exhibited by conventional bipolar transistor structures on CMOS chips. Source/drain implants need to be blocked in the CMOS channel and bipolar regions. This is achieved by using a gate conductor as a blocking layer in conventional CMOS processes. However, during the process of fabricating the CMOS transistor structures, a thin gate oxide is formed under the gate conductor. In the CMOS portion of the circuit, the thin gate oxide is used to electrically isolate the gate conductors of MOS transistors from their underlying channel regions. Without an insulator between the conducting gates of the MOS transistors and the underlying silicon of the channel regions, the MOS transistors would not operate. properly. However, the presence of the gate oxide on top of the silicon makes it difficult to form a low-resistance base in the bipolar transistor structures.

Figure 1:
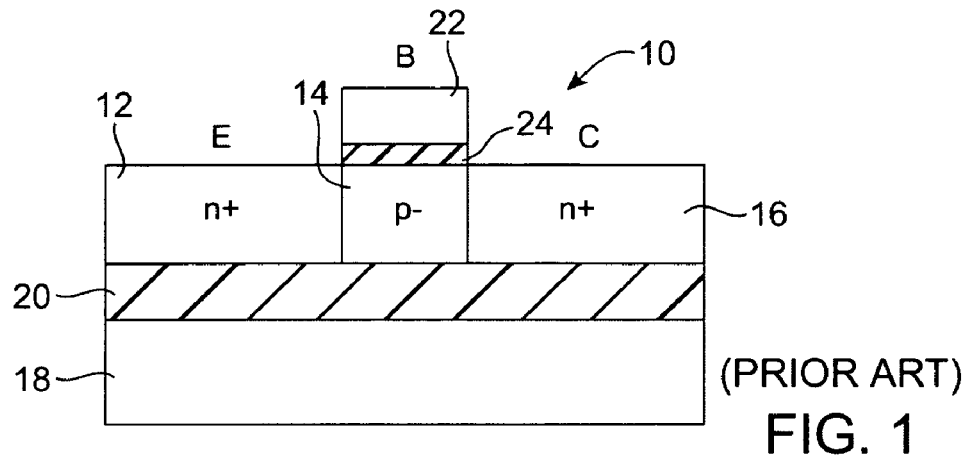
FIG. 1 is a cross-sectional side view of a conventional bipolar transistor formed on a CMOS circuit showing how gate oxide lies between the gate mask polysilicon and the underlying base region.

A cross-sectional side view of a bipolar transistor formed on a CMOS circuit using a conventional fabrication process is shown in FIG. 1. The bipolar transistor 10 has a heavily-doped emitter region 12, a lightly-doped base region 14, and a heavily-doped collector region 16, which are formed from silicon. These regions are formed on a silicon-on-insulator wafer 18 having a buried silicon oxide layer 20. The emitter region 12 and collector region 16 have a doping type (n-type in the example of FIG. 1) that is the opposite of the doping type used for base region 14 (which is p-type in this example).

A gate conductor line 22 is used as an implant mask—allowing the n+ emitter and collector regions 12 and 16 to be formed by ion implantation. The width of gate conductor line 22 defines the narrowest lateral dimension of the bipolar transistor 10 (called the "base width"). At the same time, in the CMOS portion of the circuit, each MOS transistor has a similar gate conductor line formed from the same gate conductor layer that defines its narrowest lateral dimension (called the "gate length"). The size of lines such as line 22 depends on the process technology being used to form the circuit. A typical line might be about 0.1 microns in its narrow lateral dimension. The other lateral dimension is typically much greater (e.g., 1-2 microns or more).

In the MOS portion of the chip, the gate conductor layer of the gate conductor line 22 is used to form the gate conductor. Accordingly, it is necessary to form a thin gate dielectric 24 under the gate conductor of line 22. In the MOS devices on the chip, dielectric layer 24 serves as the required gate dielectric layer. In the bipolar devices on the chip, however, the dielectric layer 24 makes it difficult to form a low-resistance connection to base region 14.

Figure 2:
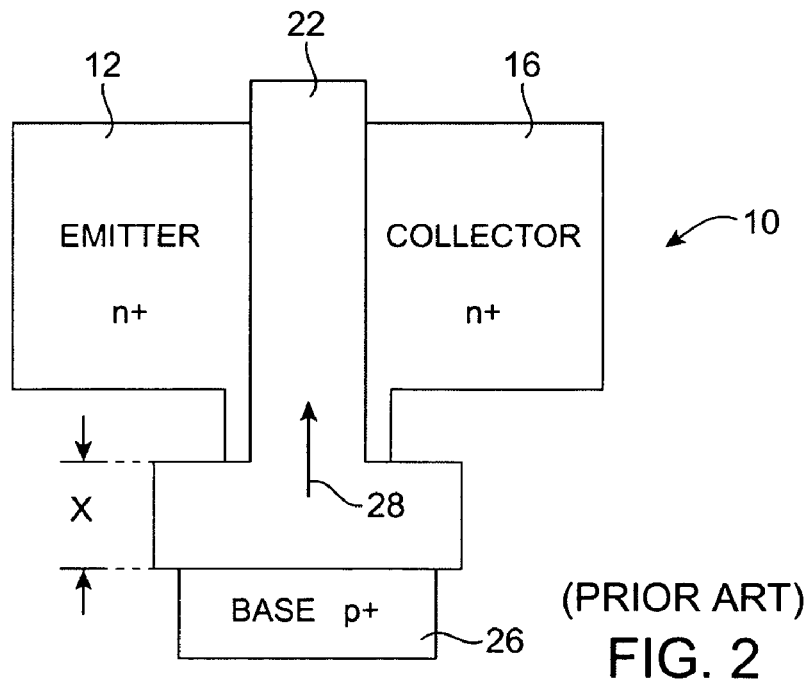
FIG. 2 is a top view of the conventional bipolar transistor of FIG. 1.

A top view of the conventional bipolar transistor 10 of FIG. 1 is shown in FIG. 2. As shown in FIG. 2, because it is not possible to form an electrical contact to the base region through dielectric layer 24, electrical contact to the base region is made using a laterally-offset base contact region 26 (called the "body contact") to connect to the base region 14. A corresponding laterally-offset base conductor is used to form the base terminal of the transistor 10. The base conductor is deposited on top of body contact 26. The body contact 26 is heavily doped (p+), so that a good ohmic contact is formed between body contact 26 and the base conductor.

A spacing X of about 0.4 microns is required between the body contact 26 and the adjacent end of the base region 14 to ensure that the p+ diffusion for the body contact does not interfere with the nearby n+ doping regions of the emitter and collector. In this portion of the structure, the polysilicon line 22 is widened to form the inverted "T" shape shown in FIG. 2.

Figure 3:
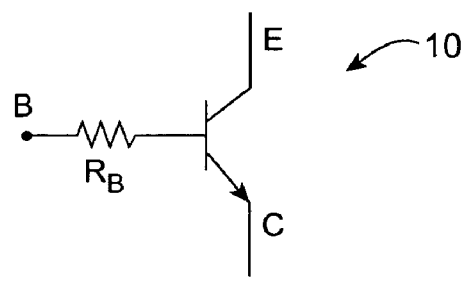
FIG. 3 is a schematic representation of the conventional bipolar transistor of FIGS. 1 and 2.

With the conventional base contact arrangement of FIGS. 1 and 2, base current can only enter the base region 14 that lies between the emitter region 12 and collector region 16 from the end of the base region near body contact 26. Current flows into the base region from the body contact 26 through the widened "T" portion of the base and along the longitudinal axis of the base region 14 in direction 28. When current flows along this path, the lightly-doped base region acts as a distributed resistor. This results in a non-negligible resistance $R_B$ (called the "extrinsic base resistance" or the "base resistance") in series between the base terminal B at body contact 26 and the portion of the base lying between emitter region 12 and collector region 16. The base resistance $R_B$ is shown in the schematic diagram of transistor 10 in FIG. 3.

Figure 4:
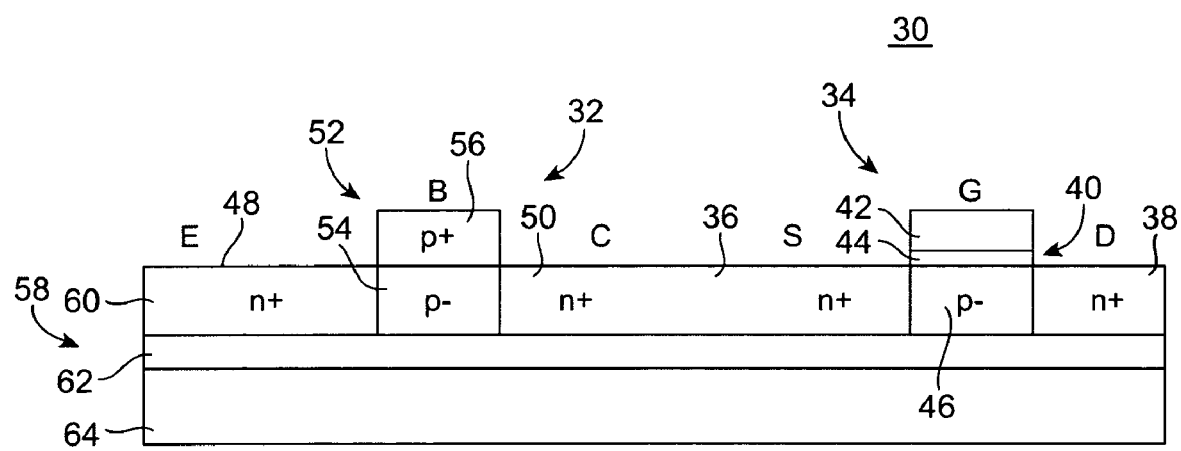
FIG. 4 is a cross-sectional side view of a portion of an illustrative CMOS integrated circuit with a low-base-resistance bipolar transistor formed on a silicon-on-insulator (SOI) substrate in accordance with the present invention

The present invention provides bipolar transistors on CMOS integrated circuits with reduced values of base resistance $R_B$ and corresponding improvements in bipolar performance. A cross-sectional side view of an illustrative CMOS integrated circuit 30 having a bipolar transistor 32 and an MOS transistor 34 is shown in FIG. 4. Integrated circuit 30 may be referred to as a "CMOS integrated circuit" because most of the circuitry on integrated circuit 30 is CMOS circuitry formed from MOS transistors such as MOS transistor 34. The integrated circuit 30 is therefore fabricated using a CMOS-based fabrication process. Such CMOS fabrication processes use mask sets, deposition, etching, implantation, and other semiconductor fabrication steps that are designed to produce high-performance CMOS transistor circuitry, although bipolar transistors can also be produced at the same time. In contrast, "bipolar integrated circuits" contain bipolar transistors fabricated using processes that are optimized for producing bipolar transistors. The term "BiC-MOS" is sometimes used to refer to CMOS circuits that have significant amounts of bipolar circuitry. Circuit 30 may be a "BiCMOS" circuit or a "CMOS integrated circuit." The term "CMOS integrated circuit" is used herein for clarity.

As shown in FIG. 4, the MOS transistor 34 of CMOS integrated circuit 30 has a source 36, a drain 38, and a gate 40. The gate 40 has a gate conductor 42 and an insulating gate dielectric 44 (e.g., silicon oxide) that separates the gate conductor 42 from underlying channel region 46.

The bipolar transistor 32 has an emitter 48, a collector 50, and a base 52. The base 52 has an active base region 54 that lies between the emitter region 48 and the collector region 50. The base region is lightly-doped (e.g., the base region generally has a doping concentration of less than $10^{17}$ cm$^{-3}$ when formed from silicon or silicon-germanium). The base 52 also has a base conductor 56 that overlies the base region 54. The base conductor may be formed from a heavily-doped semiconductor (e.g., the base conductor 56 may have a doping concentration of about $10^{19}$ cm$^{-3}$ or $10^{20}$ cm$^{-3}$ when the base conductor is formed from silicon or silicon-germanium).

In a typical arrangement, the width of the base (its narrower lateral dimension) may be about 0.1 microns. Its length (its longer lateral dimension) may be about one or two microns (as an example). The base conductor 56 may be electrically connected to the base region 54 along its entire length. Unlike conventional bipolar transistors formed on CMOS circuits, the bipolar transistor of FIG. 4 does not have a gate dielectric layer 44, so there is no dielectric interposed between base region 54 and the conductive region 56. Because there is no intervening gate dielectric between the heavily-doped high-conductivity base conductor 56 and the lightly-doped base region 54, the base conductor 56 serves as a low-resistance parallel current path that reduces the base resistance of transistor 32.

The integrated circuit 30 may be formed from a semiconductor substrate 58. Substrate 58 may be formed from a silicon wafer or any other suitable semiconductor. After processing is complete, the silicon wafer or other substrate may be divided into numerous "die" each of which can be packaged to form a complete CMOS integrated circuit.

Figure 5:
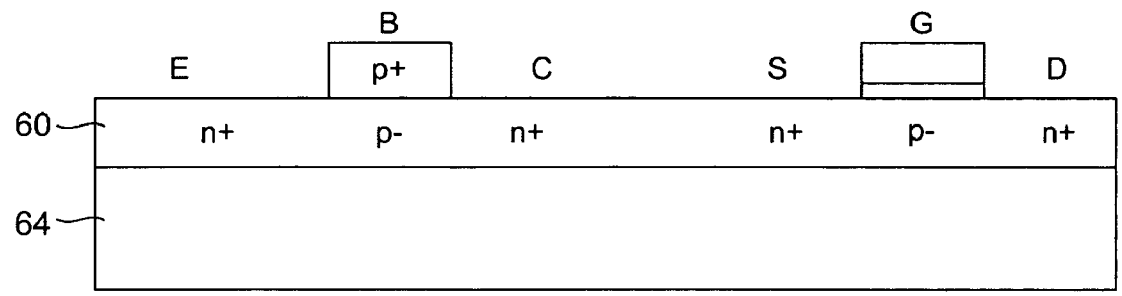
FIG. 5 is a cross-sectional side view of a portion of an illustrative CMOS integrated circuit with a low-base-resistance bipolar transistor formed on a bulk silicon substrate in accordance with the present invention

If desired, substrate 58 may have an epitaxial layer 60. The epitaxial layer 60 may be formed from silicon, silicon-germanium, or any other suitable semiconductor. Substrate 58 may be a silicon-on-insulator (SOI) wafer (or other semiconductor-on-insulator substrate) that includes a buried insulator layer 62 such as a silicon oxide layer formed on top of an underlying silicon region 64. Alternatively, integrated circuit 30 may be formed from a substrate 58 that is a "bulk" (non-SOI) wafer, as shown in FIG. 5. When a "bulk" substrate is used, the buried insulating layer 62 is not present.

The illustrative bipolar transistor of FIGS. 4 and 5 is an npn transistor having n-type emitter and collector regions and a p-type base. Circuit 30 may also have pnp bipolar transistors. Similarly, the MOS transistor 34 of FIGS. 4 and 5 is an n-channel MOS (NMOS) transistor, whereas CMOS circuit 30 contains both NMOS and p-channel MOS (PMOS) transistors. The structures of the pnp bipolar transistors and PMOS transistors are identical to the structures of FIG. 4, except that the doping types are reversed (n becomes p and p becomes n).

Although the collector region 50 of transistor 32 is shown as being adjacent to the source region 36 of transistor 34, this is merely for convenience so that both transistor 32 and transistor 34 will fit in the drawing. In general, transistors 32 and 34 need not be located adjacent to each other and need not be electrically interconnected, although they are both formed on the same substrate 58.

Cross-sectional side views of a CMOS integrated circuit 30 during the process of forming bipolar transistors 32 and CMOS transistors 34 are shown in FIGS. 6-13. The integrated circuit shown in FIGS. 6-13 is formed on a silicon-on-insulator substrate. This is merely illustrative. If desired, the integrated circuit 30 of FIGS. 6-13 may be formed using a bulk silicon substrate of the type shown in FIG. 5 or any other suitable substrate.

As is well known, semiconductor structures for integrated circuits can be fabricated using photolithography. It is generally desirable to minimize the number of photolithographic "masks" that are used to form a given circuit. In the present invention, bipolar transistors with reduced base resistance can be formed using only one more photolithographic mask than would be used when fabricating conventional bipolar-on-CMOS structures of the type described in connection with FIGS. 1-3. The additional photolithographic mask can be used to form a patterned base masking layer that serves to define the base regions of the bipolar transistors. By using a base masking layer that is separate from the patterned gate conductor lines used to define the CMOS gates, bipolar base regions can be formed that are not covered with gate oxide. This allows a base conductor to contact the base region along its entire length, not just at its end. The base conductor therefore serves as a low-resistance parallel path for conducting base current to the base region, thereby reducing the extrinsic resistance of the base.

Figure 6:
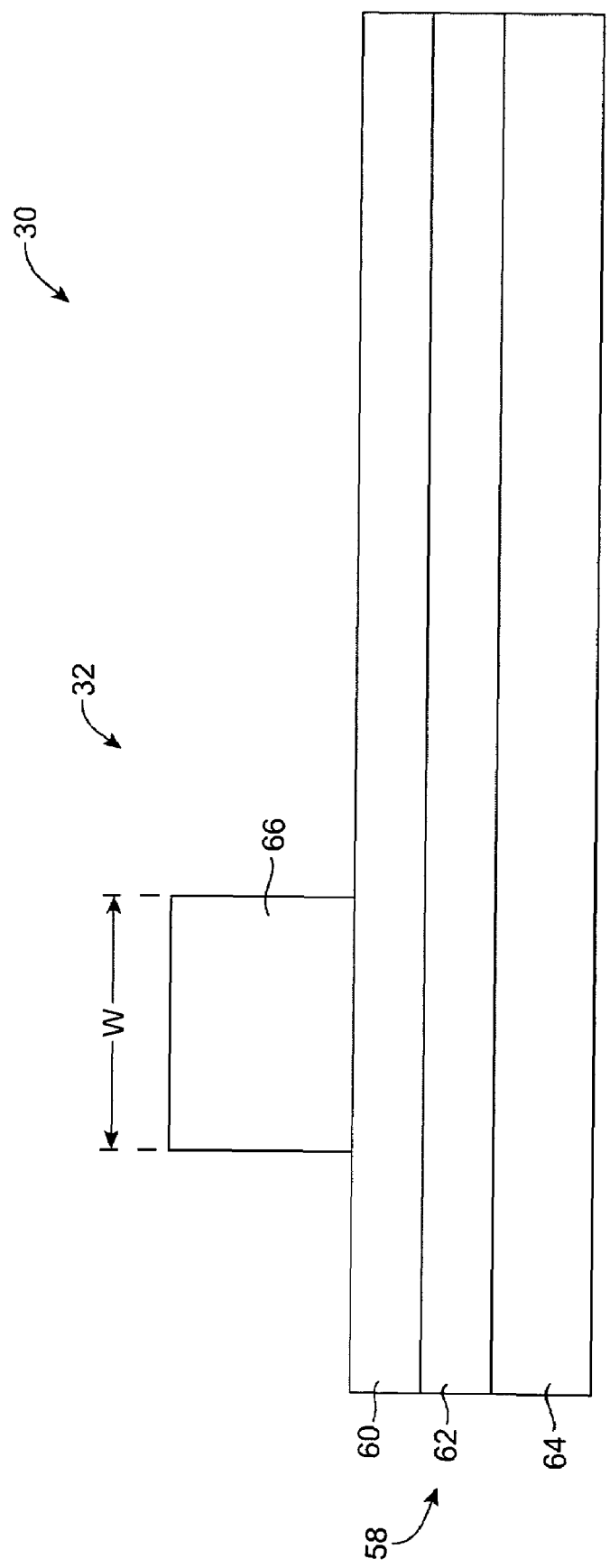
FIGS. 6-13 are cross-sectional side views of an illustrative integrated circuit on which both bipolar and CMOS circuitry is formed on SOI substrate in accordance with the present invention.

A cross-section of integrated circuit 30 during the process of defining the bipolar base region is shown in FIG. 6. Initially, upper substrate layer 60 of substrate 58 is coated with a layer of base masking material. Any suitable material may be used for the base masking layer. With one suitable approach, a layer of silicon-germanium is deposited on the surface of substrate layer 60 (which may be, e.g., a silicon epitaxial layer) by chemical vapor deposition. If desired, other deposition techniques may be used. The deposited base masking layer is then patterned to form patterned base masking layer 66. Base masking layer 66 may, for example, be patterned by photolithography and etching.

Patterned base masking layer 66 is a sacrificial layer that serves as an ion implantation mask. The narrowest lateral dimension of masking layer 66 defines the base width W. The base width W is typically selected to be as short as possible, within the constraints of the process technology being used. The base width W may, for example, be 0.15 microns, 0.13 microns, 90 nm, 65 nm, or less than 65 nm. The base masking layer 66 is preferably patterned over the entire surface of the substrate layer 60, so that numerous bipolar transistors may be fabricated in parallel. Only the portion of the base masking layer 66 used to form a single bipolar transistor base is shown in FIG. 6 to avoid overcomplicating the drawing.

Figure 7:
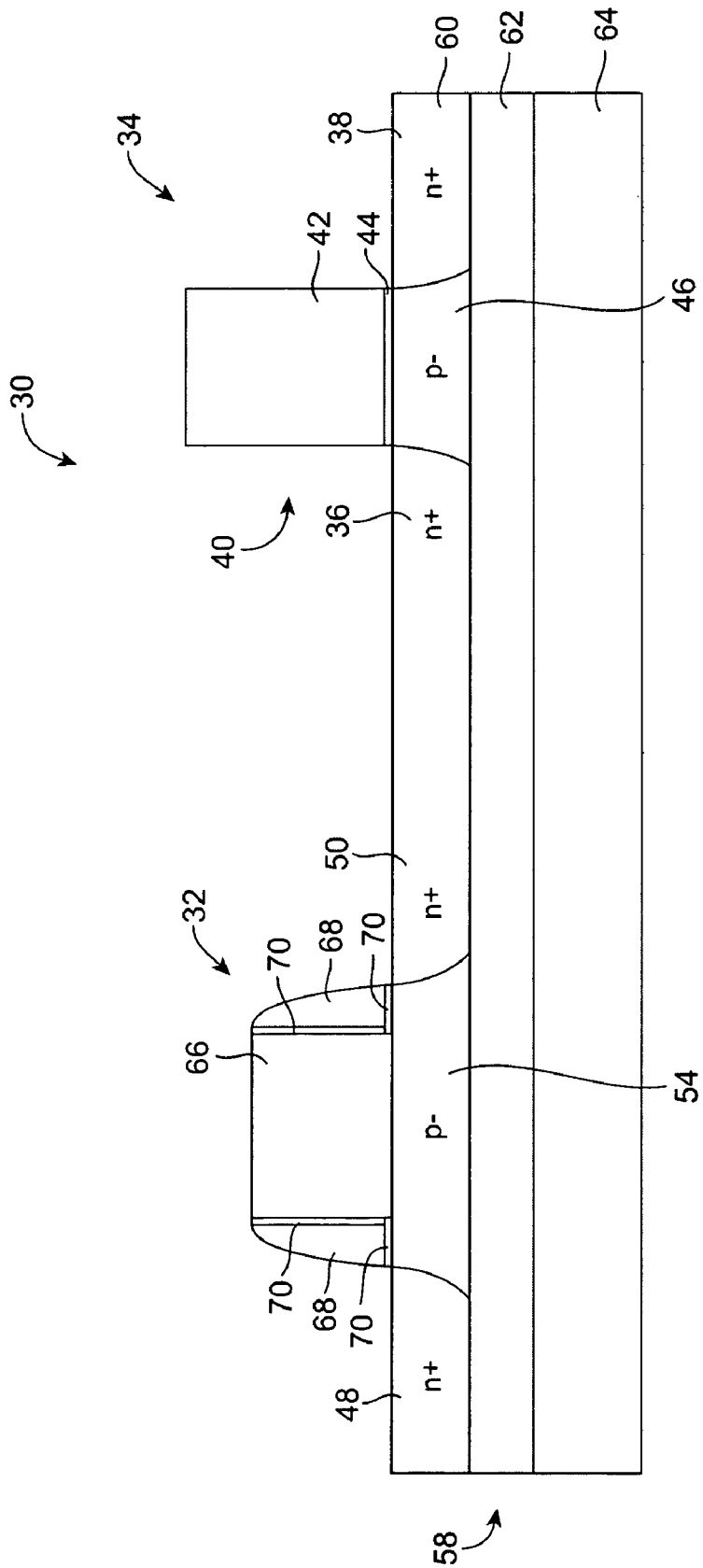

After the base masking layer 66 has been patterned, the gate stack for the CMOS transistors may be formed. A cross-section of the integrated circuit 30 after stack formation is shown in FIG. 7. During gate stack formation, the gate 40 of the MOS transistor 34 is formed. Gate 40 has a gate conductor line 42 (e.g., a doped polysilicon line) or other suitable conductor and an underlying gate dielectric layer 44 of any suitable gate insulator. The gate 40 may be formed by forming a layer of gate dielectric 44 by thermal growth or a suitable deposition technique. The gate conductor 42 may then be deposited (e.g., by growing a doped layer of polysilicon using chemical vapor deposition techniques). The gate conductor layer 42 may be patterned by etching. Following gate conductor etching, the gate dielectric 44 may be patterned by etching.

The base masking layer 66 is already present when the gate dielectric 44 is formed, so the gate dielectric 44 is deposited on the top and sidewalls of the base masking layer 66 as shown in FIG. 7. Thermally grown gate oxide 44 will grow conformally, covering the entire exposed surface of substrate 58 and the exposed top and sidewall surfaces of silicon-germanium base masking layer 66. After the gate dielectric layer has been formed, the gate conductor layer 42 may be deposited.

During etching to pattern the gate conductor, the gate 40 is defined. Residual gate conductor regions 68 from the gate conductor layer 42 may remain on the sidewalls of the gate dielectric-covered base masking region 66 following gate conductor etching, because sidewall portions of the structures on integrated circuit 30 are harder to etch clean than flat exposed surfaces. After the gate conductor layer has been etched, the gate dielectric layer can be etched, producing the structures shown in FIG. 7.

After the gate conductor has been etched, the first (low-dose/energy) part of a two-part "low-density drain" (LDD) source-drain ion implantation process may be performed. Initially, substrate layer 60 in the vicinity of transistors 32 and 34 may be doped p-type (as an example). The LDD implant may then be used to dope the source and drain regions 36 n-type by doping these regions to an n-type doping concentration that is greater then the doping concentration of the initial p-type doping. The LDD implant therefore forms source and drain regions 36 and 38. The process is self-aligned, because the same structure that is used as the implantation mask for the channel (i.e., gate conductor line 44) is also used as the gate conductor. The n-type bipolar emitters and collectors of the bipolar transistor 32 are formed during the same LDD n-type implant process as the n-type sources and drains. (The same type of LDD process is also repeated for p-type implantation of collectors and emitters for any pnp transistors present on the circuit 30 and for p-type implantation of sources and drains in the PMOS transistors on the circuit 30.)

During the LDD implants (or other suitable CMOS ion implantation process), the base masking region 66 serves as an ion implantation masking layer and prevents dopant from being implanted in base region 54. The base masking region 66 therefore defines the bipolar base region in substrate layer 60. (Because of the presence of residual gate conductor layers 68, the boundaries between the p-type base region 54 and the n+ emitter and collector regions 48 and 50 may form a base region that is slightly larger than the nominal width of base masking layer 66, as shown in FIG. 7.)

Figure 8:
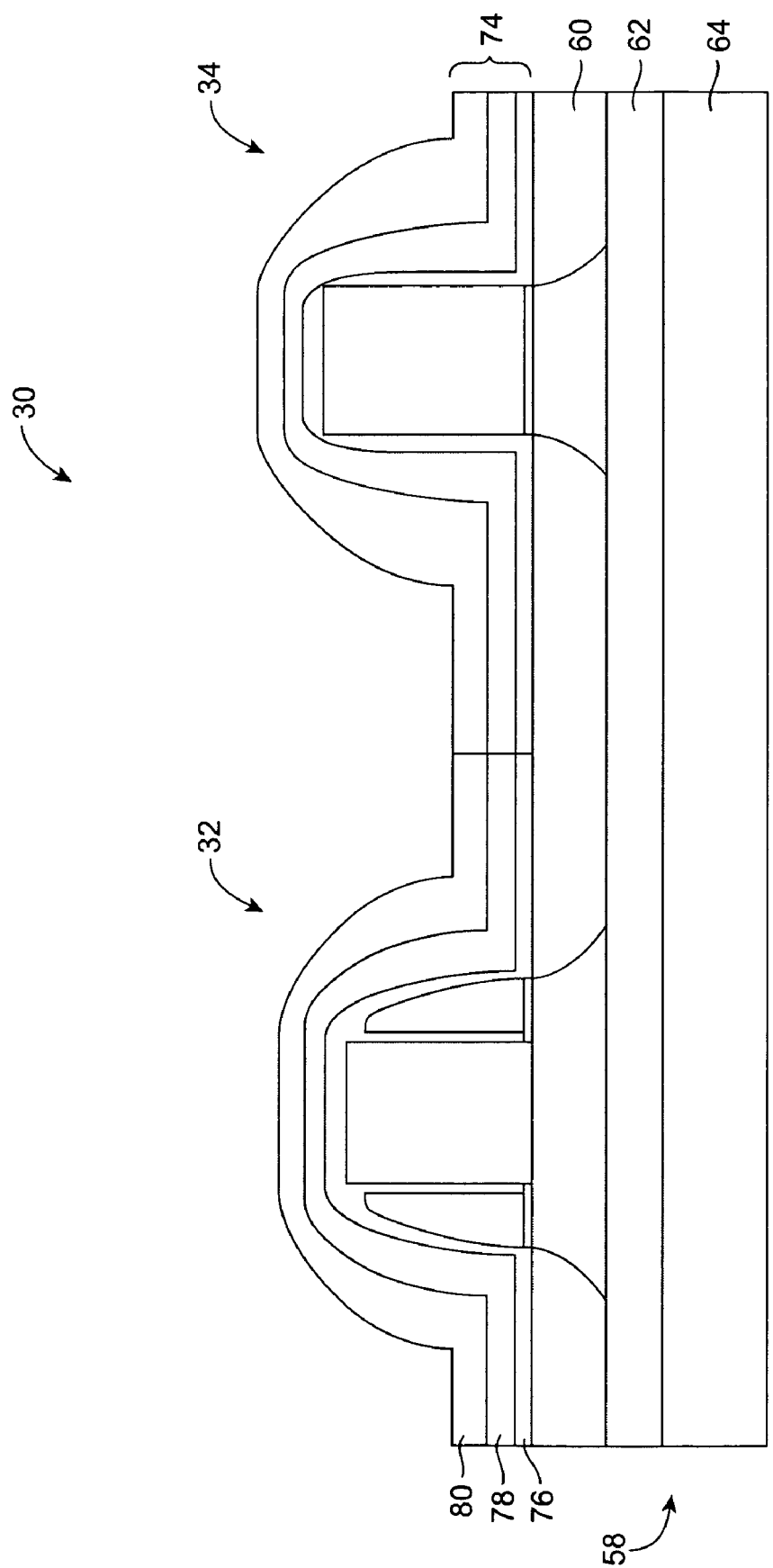

After the first (low-dose/energy) source-drain implant is complete, a spacer layer may be formed, as shown in FIG. 8. Spacer layer 74 may be formed using any suitable technique. With one suitable approach, spacer 74 is formed by depositing a layer of silicon oxide 76, a layer of silicon nitride 78, and a layer of silicon oxide 80.

Figure 9:
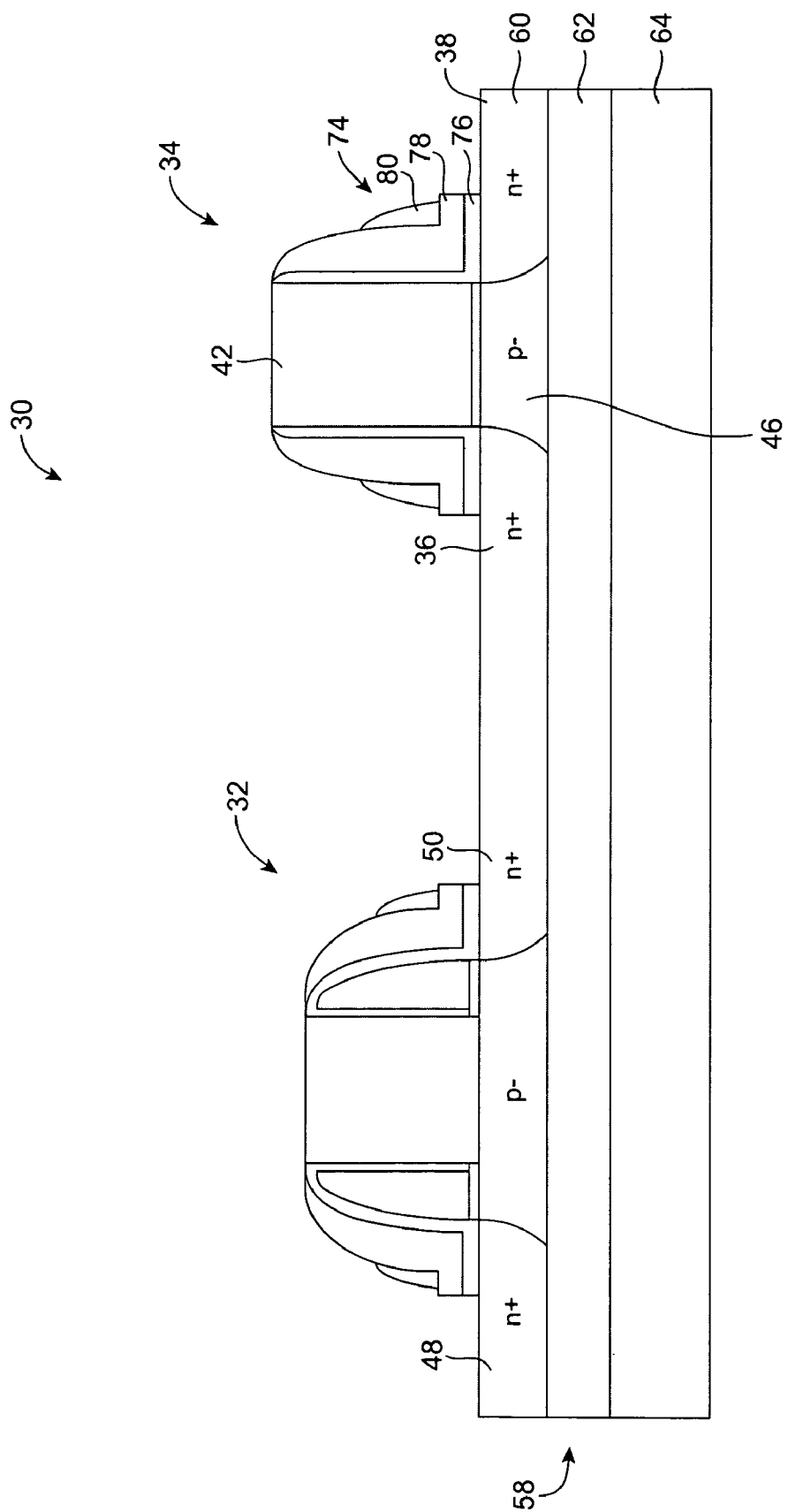

After the spacer layer 74 has been formed, the spacer layer 74 may be anisotropically etched to form the structures shown in FIG. 9. The spacer layer 74 may be patterned by etching. During etching, incomplete etching in the vicinity of the existing base and gate structures causes residual portions of the spacer layer 74 to remain. In particular, residual portions of the spacer layer 74 remain attached to the sidewalls of base masking layer 66 and gate conductor 42, as shown in FIG. 9.

After forming the lateral spacer structure of FIG. 9 by depositing and etching the spacer layer 74, the second part of the two-part LDD ion implantation process may be performed, depending on the integration scheme of the process. During this part of the LDD implant, a second (high-density) source-drain implant is performed. This adds additional n+ dopant to the n-type sources, drains, collectors, and emitters of the structures shown in FIG. 9.

Figure 10:
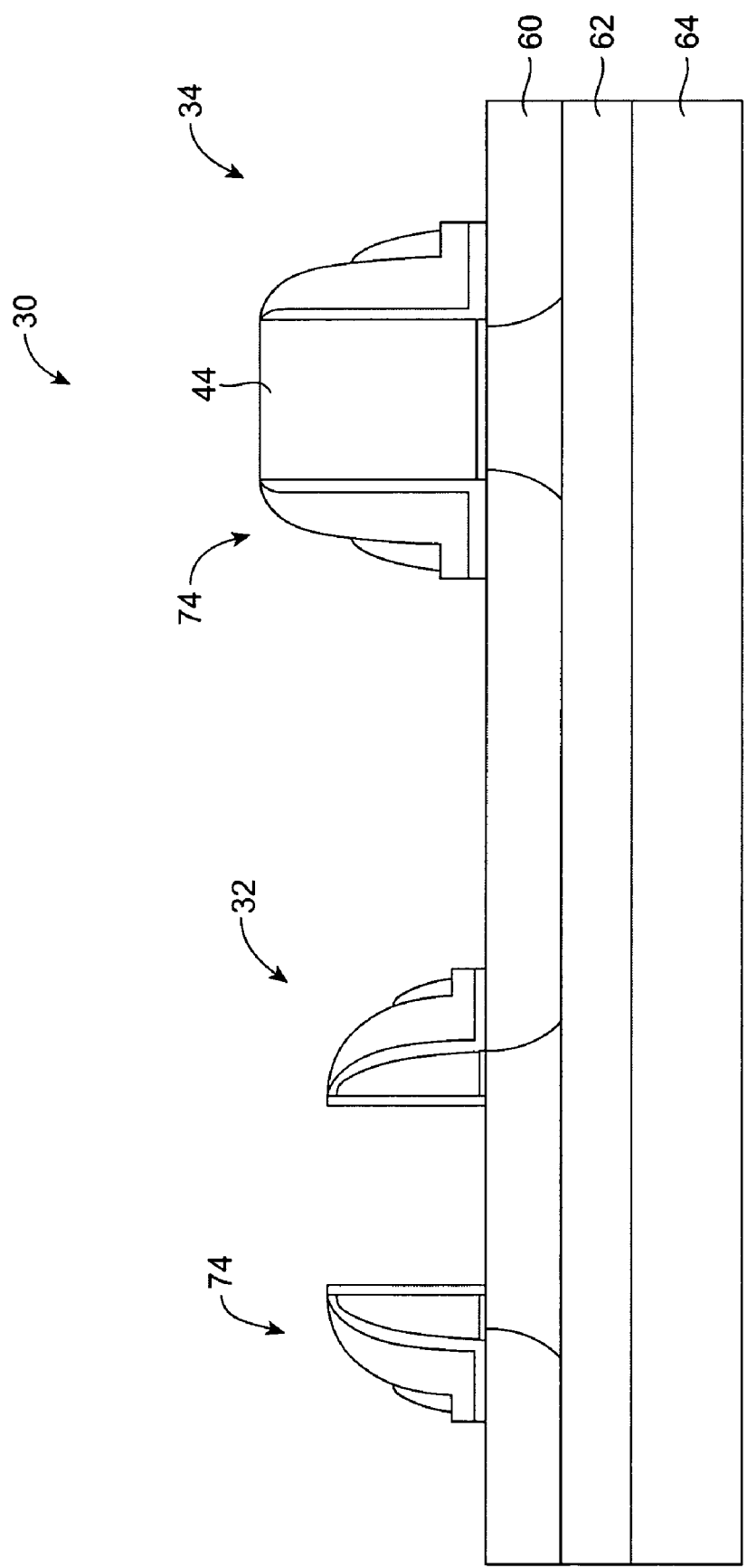

As shown in FIG. 10, after the second LDD implant is complete, the base masking layer 66 may be removed by etching. Any suitable etchant may be used to remove the base masking layer 66. With one suitable arrangement, the etchant used to remove base masking layer 66 has a high etch selectivity and preferentially etches silicon-germanium over gate conductor and gate dielectric. As a result, even though the gate conductor 44 and the gate dielectric and nitrides of spacer 74 are exposed to etchant, these structures will not be etched. This preserves the gate structure of the CMOS transistors during base masking layer removal.

Figure 11:
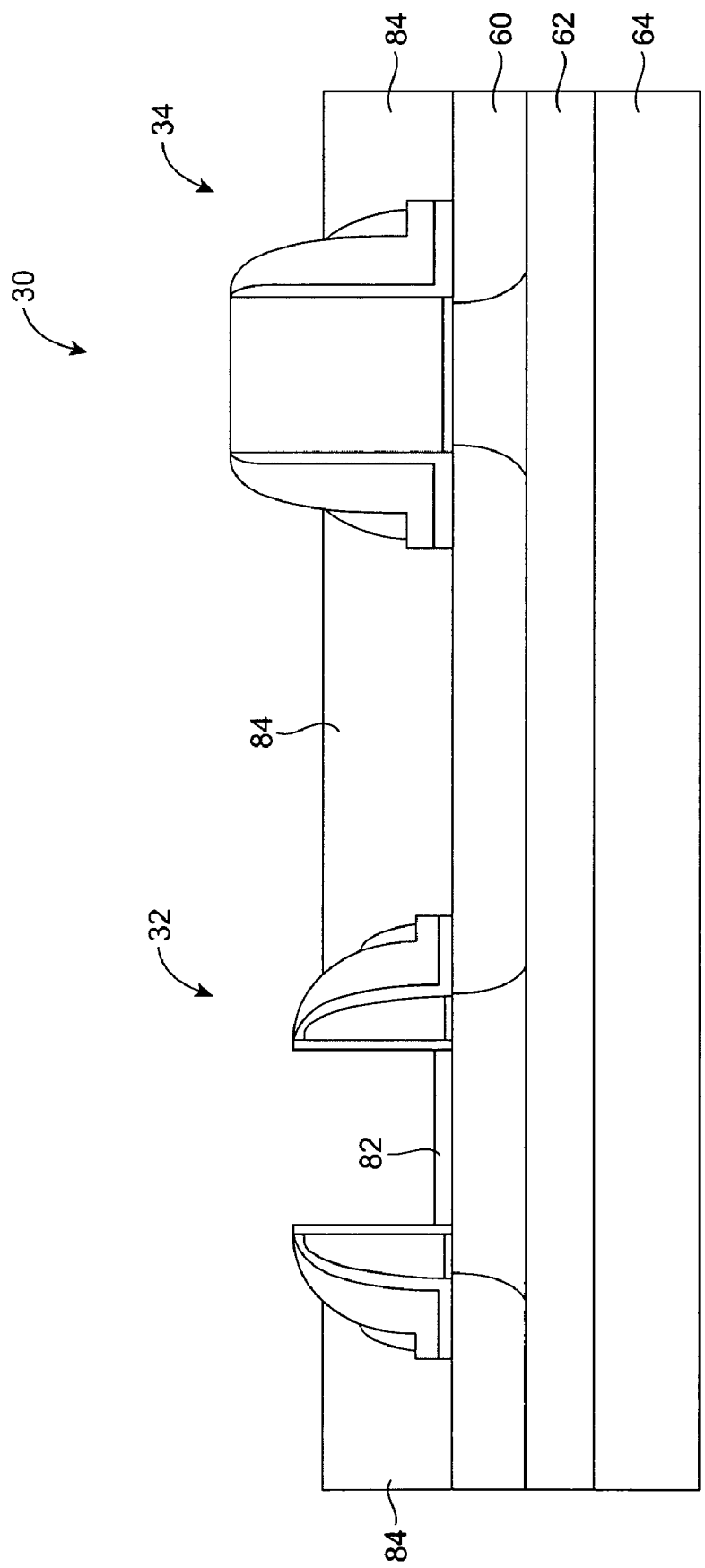

As shown in FIG. 11, after the base masking layer 66 has been removed, a first (n+) hard mask (i.e., a silicon nitride mask or other suitable mask for preventing epitaxial growth of silicon) may be formed in the base of transistor 32. The hard mask may also be formed elsewhere on suitable p-type regions of integrated circuit 30 where it is desired to inhibit epitaxial n+ silicon growth.

After n+ epitaxial growth mask 82 has been formed, an n+ epitaxial silicon layer 84 may be grown. (This type of n+ epitaxial growth process is used to increase the source and drain thicknesses of MOS transistors in conventional CMOS circuits.) The n+ growth of layer 84 increases the thickness of emitter region 48, collector region 50, source region 36, and drain region 38, but no n+epitaxial silicon grows over mask 82.

Figure 12:
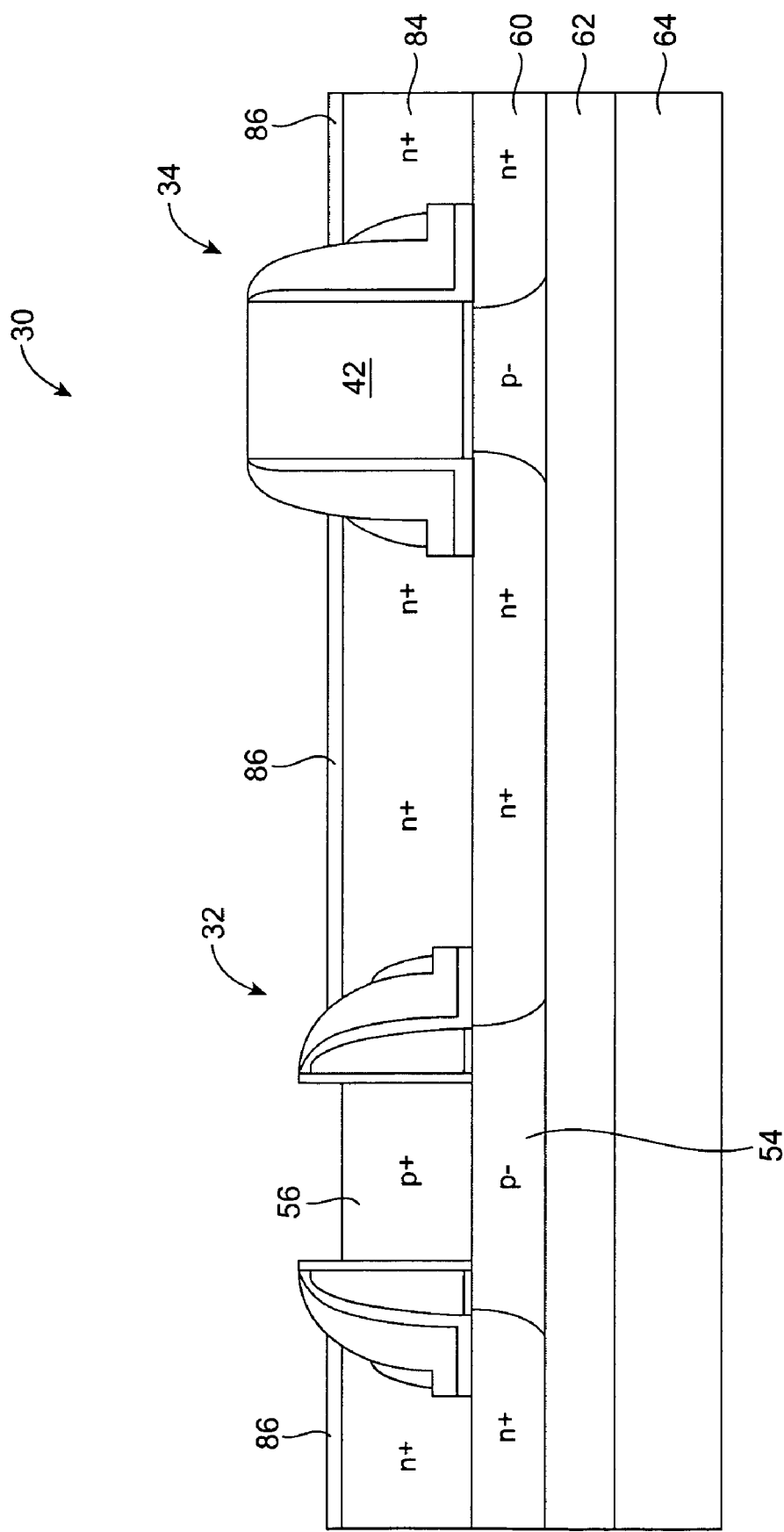

CMOS integrated circuits have both NMOS and PMOS transistors, so following n+ epitaxial growth and removal of the n+ epitaxial growth mask 82, a second hard mask 86 (the "p+ epitaxial growth mask") may be formed, as shown in FIG. 12. Mask 86 and mask 82 of FIG. 11 may be formed from silicon nitride or any other suitable material that inhibits silicon epitaxial growth. Masks 82 and 86 may be patterned using any suitable approach, such as using photolithography and etching.

After mask 86 has been deposited and patterned, p+ epitaxial silicon layer 88 may be grown in the regions not covered by mask 86. Crystalline epitaxial silicon (or other suitable semiconductor layers such as crystalline silicon-germanium) may be grown by chemical vapor deposition or other suitable growth techniques. Because the base region 54 is not covered by mask 86, conductive p+ material grows on top of the lightly-doped base region 54 and forms base conductor 56. As described in connection with FIG. 4, conductor 56 serves as a low-resistance parallel current path for the base current and makes good electrical contact with the underlying base region 54 along its entire length because there is no intervening gate oxide 44 between conductor 56 and region 54. The presence of conductor 56 therefore serves to lower the extrinsic base resistance $R_B$ of the base of transistor 32. (Bipolar pnp transistors are provided with lowered base resistances by forming n+conductors over their lightly-doped n-type base regions during the n+ epitaxial growth step defined by the mask 82).

Figure 13:
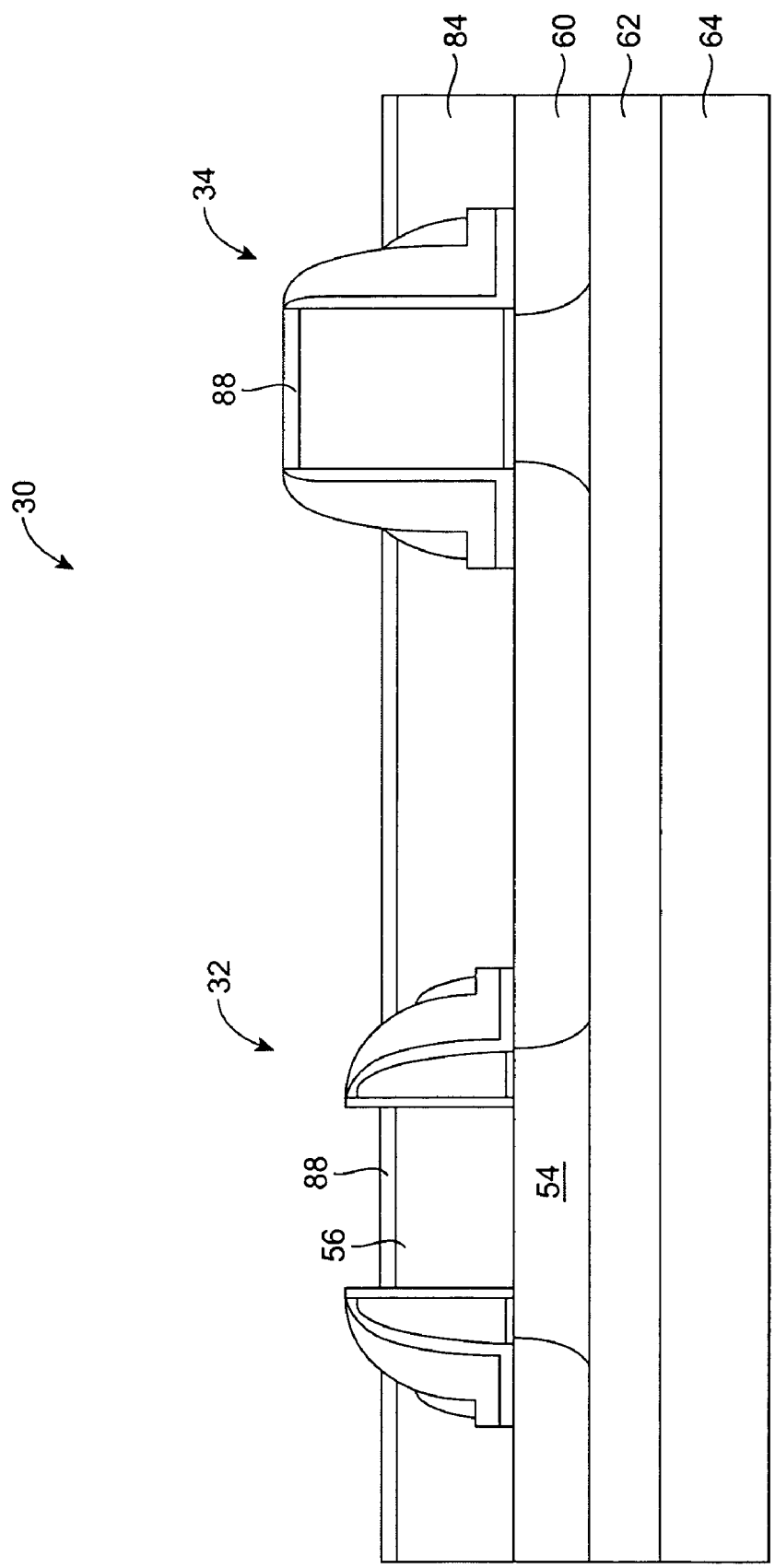

The resistivity of conductor 56 and the resistivity of gate conductor line 42 are preferably low due to their high doping concentrations. Further reductions in the resistances of these conductors can be achieved by forming silicides on their upper surfaces. As shown in FIG. 13, the p+ epitaxial growth mask 86 may be removed (e.g., by etching), followed by formation of silicide layer 88. Silicide 88 may be any suitable silicide, such as titanium silicide, cobalt silicide, nickel silicide, tungsten silicide, a combination of such materials, or any other suitable conductive material that assists lowering the resistance of the conductors in transistors 32 and 34. The process of forming silicide layer 88 on circuit 30 is self aligned, because the topography of the circuit and the isolation of the exposed silicon surfaces from each other prevent the different silicide regions from forming short circuits.

After the surface of circuit 30 has been silicided, the CMOS/bipolar fabrication process may be completed (e.g., by forming tungsten contacts for the transistor terminals, by depositing layers of dielectric and interconnects for the interconnect stack, by dicing the substrate 58 into individual die and by packaging and testing each circuit 30, etc.). During these fabrication steps, a base body contact or other suitable arrangement may be used to form an ohmic electrical connection between the base terminal metal (e.g., tungsten) and the base conductor 56 (e.g., the doped silicon epitaxial layer and silicide of conductor 56 of FIG. 4).

Figure 14A:
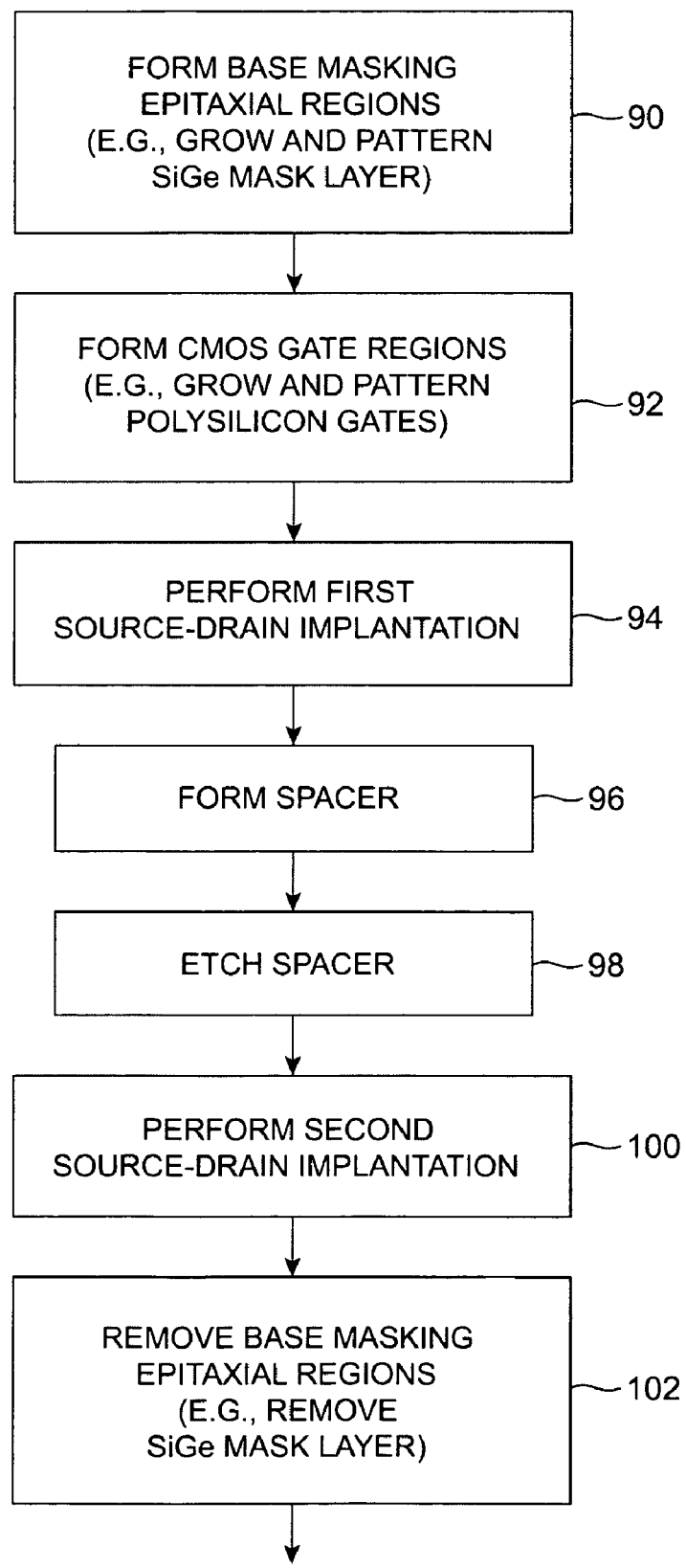
FIGS. 14a and 14b are flow charts of illustrative steps involved in forming an integrated circuit in accordance with the present invention. The second source/drain implants are optional and depend upon which "front-end-of-line" processes are used.
Figure 14B:
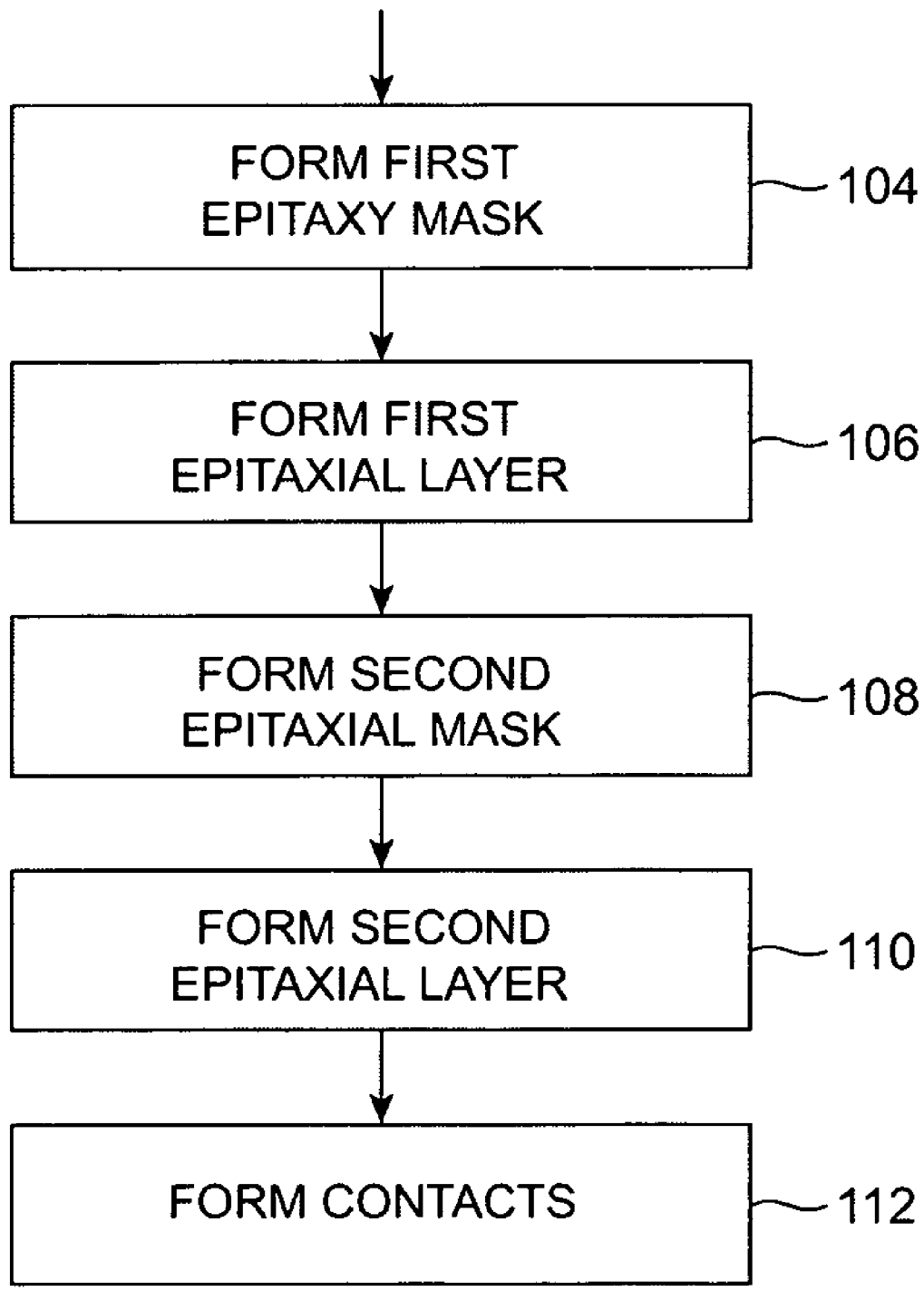

Illustrative steps in forming bipolar transistors 32 with reduced base resistances on a CMOS integrated circuit 30 are shown in FIGS. 14a and 14b.

At step 90, a base masking layer 66 (FIG. 6) is formed on the substrate layer 60 of substrate 58. Substrate 58 may be a silicon-on-insulator substrate or may be a bulk silicon substrate. Base masking layer 66 may be silicon-germanium or another suitable material suitable of forming an implantation mask. Base masking layer 66 may be formed from epitaxially-grown crystalline semiconductor. Base masking layer 66 may be patterned using photolithography and etching or any other suitable technique.

At step 92, the CMOS gates on circuit 30 such as gate 40 of FIG. 7 are formed. Gate layers may be formed by gate dielectric growth followed by gate conductor deposition. The gate layers may be patterned by gate conductor etching and gate dielectric etching.

At step 94, a first source-drain ion-implantation step may be performed. The ion-implantation of step 94 may, for example, be a low-dose/energy implant associated with a lightly-doped-drain (LDD) implantation process. During the first LDD implant of step 94, the gate conductor lines and the base masking layer serve as implant masks that prevent dopant from reaching the underlying silicon substrate.

At step 96, a spacer layer may be deposited. The spacer layer may, for example, be formed by depositing successive layers of silicon oxide, silicon nitride, and silicon oxide. At step 98, a spacer such as the spacer of FIG. 9 may be formed by patterning the spacer layers (e.g., by photolithography and etching).

At step 102, the patterned base masking layer 66 is removed (e.g., by etching). The removal process is preferably selective, so that exposed polysilicon gate lines and oxides are not damaged during base masking layer removal.

After the base masking layer is removed at step 102, a first epitaxial growth mask may be formed at step 104 (FIG. 14b). The first epitaxial growth mask may, for example, by a silicon nitride mask that is formed by silicon nitride layer deposition and photolithographic patterning. The epitaxial growth mask may be (for example) an n+ growth mask that is used to cover otherwise exposed p-type regions on the circuit.

At step 106, a heavily-doped epitaxial silicon layer (e.g., an n+ silicon layer) is grown on the substrate. The first mask prevents growth of this n+ layer on p-type regions of the circuit. The epitaxial silicon layer grows on top of n-type regions to increase their thickness sufficiently to form satisfactory transistor structures.

During steps 108 and 110, the epitaxial masking and growth process is repeated, for the opposite doping type. If the first mask (at step 104) was used to cover p-type regions, for example, the mask formed at step 108 can be used to cover n-type regions.

During step 110, a p+ epitaxial layer is grown on the substrate of circuit 30. Because of the presence of the second epitaxial growth mask, epitaxial growth is inhibited over the n-type regions, but epitaxial growth over appropriate p+ regions is permitted, thereby increasing the thicknesses of these regions.

The epitaxial growth of the steps 106 and 110 increases the thickness of the source and drain regions of the MOS field-effect transistors in the CMOS portion of the CMOS circuit 30. The same epitaxial growth steps also simultaneously increase the thicknesses of the collector and emitter regions in the bipolar transistors that are formed on the CMOS circuit.

The base regions of the bipolar transistors are not covered by gate oxide due to the presence of the base masking layer during gate formation. Accordingly, during the epitaxial growth of step 106 (for n-type bases) and step 110 (for p-type bases) a base conductor is formed directly over the lightly-doped active base regions lying between the collector and emitter regions. During the epitaxial growth steps and patterning steps of steps 104, 106, 108, and 110, a heavily-doped epitaxial semiconductor base conductor is therefore formed directly on top of each bipolar transistor base region at the same time that the sources, drains, emitters, and collectors of the same doping type are being thickened by the epitaxial growth elsewhere on circuit 30. Because the base conductors are formed from heavily-doped silicon (and subsequently formed silicide), they have low resistances. Each base conductor may extend along the entire length (or at least a substantial portion) of a corresponding base region and may be electrically connected to the base region without any intervening oxide layers. The base conductors therefore serve as parallel, low-resistance current pathways into the base regions. By forming the base conductors during the epitaxial growth steps and patterning steps of steps 104, 106, 108, and 110, the resistances of the bases in the bipolar transistors on the CMOS circuit are minimized.

At step 112, the fabrication process can be completed. Steps involved in completing the fabrication process may include siliciding the base conductors, gate conductors, and other silicon and polysilicon structures on the circuit, by forming tungsten contacts or contacts of other suitable conductive materials, by forming the insulators and conductors in the dielectric interconnect stack to interconnect the devices of circuit 30, by testing and packaging, etc.).

Figure 15:
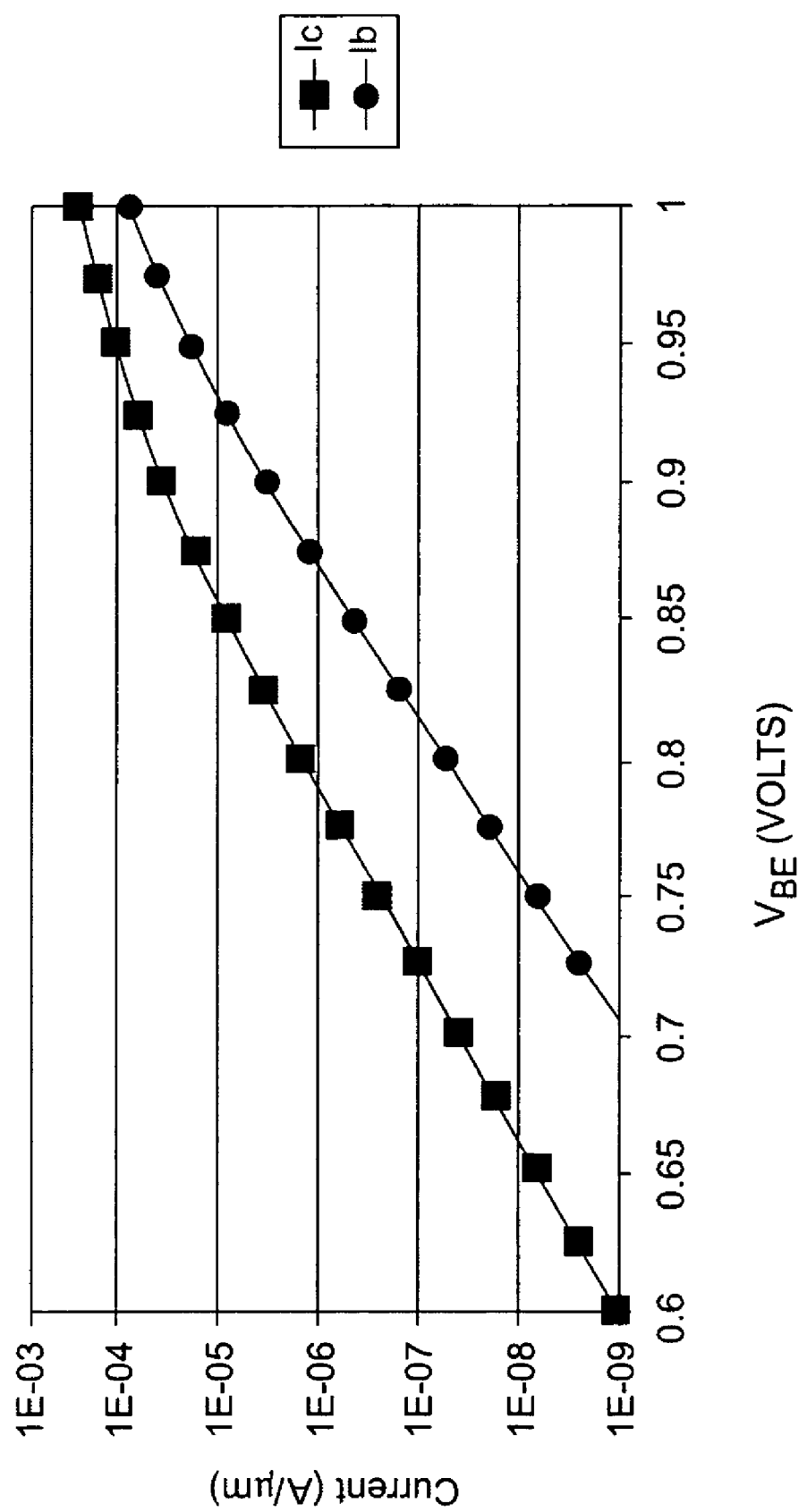
FIG. 15 is a graph showing modeling results for an illustrative bipolar transistor structure formed on a CMOS integrated circuit in accordance with the present invention.

The performance of the low-base-resistance bipolar transistors of the present invention has been investigated using a device simulation model. A silicon-on-insulator bipolar structure of the type shown in FIG. 4 was used for the simulation. Modeling results are shown in FIG. 15. In the graph of FIG. 15, the collector and base currents per micron of base width (labeled $I_c$ and $I_B$, respectively) are plotted as a function of base-emitter voltage $V_{BE}$. The ratio of these two currents represents the gain of the bipolar transistor. As shown by the graph of FIG. 15, the ratio of $I_c$ to $I_B$ remains substantially constant over a wide range of base-emitter voltages, indicating good transistor performance.

In silicon-on-insulator arrangements, the extrinsic base resistance is particularly likely to be high when a gate oxide is present over the base region, because current cannot travel into the base region through the substrate (as it is blocked by the buried SOI oxide layer). As a result, providing a base conductor that is not separated from the underlying base region by a gate oxide is particularly helpful at reducing the extrinsic base resistance for SOI structures. Use of base conductor 56 also reduces base resistance significantly in CMOS circuit arrangements based on bulk silicon substrates, although when bulk silicon substrates are used a modest amount of base current can flow through the bulk silicon that underlies the base region. While the improvement in base resistance for bulk structures is therefore not generally as dramatic as for SOI structures, the improvement can still be significant.

Although the foregoing illustrative bipolar structures have generally been described in the context of using a silicon substrate and various epitaxial silicon or silicon-germanium layers, this is merely illustrative. Any semiconductor materials may be used to form the bipolar transistors of the present invention. Moreover, even though the use of insulators such as silicon oxide and silicon nitride has been described (e.g., for gate oxides, spacers, masks, etc.), this is merely illustrative. MOS transistors and bipolar transistors may be formed using any suitable process masks and insulating layers. For example, the gate insulator used to form the MOS field-effect transistors on the CMOS integrated circuit may be formed using silicon nitride, silicon oxynitride, layers of silicon nitride, oxynitride, and oxide, or other suitable high-dielectric-constant insulating materials. The terms "CMOS" and "MOS" do not exclude the use of gate insulators formed of materials other than silicon oxide.

The foregoing is merely illustrative of the principles of this invention and various modifications can be made by those skilled in the art without departing from the scope and spirit of the invention.

What is claimed is:

1. A method of fabricating bipolar transistors on a complementary-metal-oxide-semiconductor integrated circuit having a semiconductor substrate; comprising:
   forming a patterned base masking layer on the semiconductor substrate;
   implanting ions into the substrate while the patterned base masking layer is present, wherein the base masking layer serves as an implantation mask that defines a base region in the substrate for a bipolar junction transistor; and
   removing the patterned base masking layer, wherein the semiconductor substrate comprises a bulk silicon substrate and wherein forming the patterned base masking layer comprises epitaxially growing crystalline semiconductor on the bulk silicon substrate.

2. The method defined in claim 1 further comprising forming a self-aligned gate for a metal-oxide-semiconductor field-effect transistor on the semiconductor substrate.

3. The method defined in claim 1 further comprising forming a patterned gate conductor layer that includes at least one doped polysilicon line that is used as a metal-oxide-semiconductor field-effect transistor gate conductor of a metal-oxide-semiconductor field effect transistor gate on the semiconductor substrate and that serves as an implant mask.

4. The method defined in claim 1 further comprising forming a patterned gate conductor layer that includes at least one doped polysilicon line that is used as a metal-oxide-semiconductor field-effect transistor gate conductor of a metal-oxide-semiconductor field effect transistor gate on the semiconductor substrate.

5. The method defined in claim 1 further comprising forming a base conductor on top of the base region.

6. The method defined in claim 1 further comprising forming a base conductor on top of the base region by forming a patterned epitaxial silicon layer on the base region after removing the base masking layer.

7. The method defined in claim 1 wherein forming the base masking layer comprises forming a semiconductor layer on the semiconductor substrate.

8. A method of fabricating bipolar transistors on a complementary-metal-oxide-semiconductor integrated circuit having a semiconductor substrate; comprising:
   forming a patterned base masking layer on the semiconductor substrate;
   implanting ions into the substrate while the patterned base masking layer is present, wherein the base masking layer serves as an implantation mask that defines a base region in the substrate for a bipolar junction transistor; and
   removing the patterned base masking layer, wherein forming the base masking layer comprises forming an silicon-germanium layer on the semiconductor substrate and wherein removing the base masking layer comprises etching the silicon-germanium layer, the method further comprising forming a base conductor on top of the base region after etching away the silicon-germanium layer.

9. The method defined in claim 8 wherein the semiconductor substrate comprises a silicon-on-insulator wafer and wherein forming the patterned base masking layer comprises forming a patterned base masking layer on the silicon-on-insulator wafer.

10. A method of fabricating bipolar transistors on a complementary-metal-oxide-semiconductor integrated circuit having a semiconductor substrate; comprising:
   forming a patterned base masking layer on the semiconductor substrate;
   implanting ions into the substrate while the patterned base masking layer is present, wherein the base masking layer serves as an implantation mask that defines a base region in the substrate for a bipolar junction transistor; and
   removing the patterned base masking layer, wherein the bipolar transistors each have an emitter, a collector, and a base having a base width, wherein forming the base masking layer comprises forming a silicon-germanium layer on the semiconductor substrate that defines a base region for each of the bipolar transistors, wherein each base region has a width equal to the base width that that separates the emitter and collector and has a length, wherein the semiconductor substrate has a surface, wherein the emitter and collector in each of the bipolar transistors are at a distance from each other along the surface that is equal to the base width, and wherein removing the base masking layer comprises etching the silicon-germanium layer, the method further comprising forming a base conductor on top of the base region after etching away the silicon-germanium layer, wherein the base conductor is electrically connected to the base region along its entire length.

11. A method of fabricating bipolar transistors on a complementary-metal-oxide-semiconductor integrated circuit having a semiconductor substrate; comprising:
   forming a patterned base masking layer on the semiconductor substrate;
   implanting ions into the substrate while the patterned base masking layer is present, wherein the base masking layer serves as an implantation mask that defines a base region in the substrate for a bipolar junction transistor; and
   removing the patterned base masking layer, wherein the bipolar transistors each have an emitter, a collector, and a base having a base width, wherein forming the base masking layer comprises forming a silicon-germanium layer on the semiconductor substrate that defines a base region for each of the bipolar transistors, wherein each base region has a width equal to the base width that that separates the emitter and collector and has a length, wherein the semiconductor substrate has a surface, wherein the emitter and collector in each of the bipolar transistors are at a distance from each other along the surface that is equal to the base width, and wherein removing the base masking layer comprises etching the silicon-germanium layer, the method further comprising:
   forming a base conductor on top of the base region after etching away the silicon-germanium layer, wherein the base conductor is electrically connected to the base region along its entire length; and
   forming a self-aligned gate for a metal-oxide-semiconductor field-effect transistor on the semiconductor substrate.

12. A method of fabricating bipolar transistors on a complementary-metal-oxide-semiconductor integrated circuit having a semiconductor substrate; comprising:
   forming a patterned base masking layer on the semiconductor substrate;
   implanting ions into the substrate while the patterned base masking layer is present, wherein the base masking layer serves as an implantation mask that defines a base region in the substrate for a bipolar junction transistor; and
   removing the patterned base masking layer, wherein the bipolar transistors each have an emitter, a collector, and a base having a base width, wherein forming the base masking layer comprises forming a silicon-germanium layer on the semiconductor substrate that defines a base region for each of the bipolar transistors, wherein each base region has a width equal to the base width that that separates the emitter and collector and has a length, wherein the semiconductor substrate has a surface, wherein the emitter and collector in each of the bipolar transistors are at a distance from each other along the surface that is equal to the base width, and wherein removing the base masking layer comprises etching the silicon-germanium layer, the method further comprising:
   forming a base conductor on top of the base region after etching away the silicon-germanium layer, wherein the base conductor is electrically connected to the base region along its entire length; and
   forming a self-aligned gate for a metal-oxide-semiconductor field-effect transistor on the semiconductor substrate, wherein the metal-oxide-semiconductor (MOS) field-effect transistor has a source, a drain, and a gate having a gate dielectric layer, and wherein the base conductor is electrically connected to the base region along its entire length without being blocked by intervening portions of the gate dielectric layer.

13. The method defined in claim 8 further comprising forming a self-aligned gate for a metal-oxide-semiconductor field-effect transistor on the semiconductor substrate.

14. The method defined in claim 1 further comprising:
   forming a base conductor on top of the base region; and
   forming a self-aligned gate for a metal-oxide-semiconductor field-effect transistor on the semiconductor substrate.

15. The method defined in claim 1 wherein the integrated circuit has a gate oxide layer, the method further comprising:

forming a base conductor on top of the base region, wherein none of the gate oxide layer lies between the base conductor and the base region; and forming a self-aligned gate for a metal-oxide-semiconductor field-effect transistor on the semiconductor substrate.

16. A method of fabricating bipolar junction transistors and metal-oxide-semiconductor field effect transistors on the same integrated circuit, wherein the integrated circuit has a semiconductor substrate; comprising:

forming a metal-oxide-semiconductor transistor on the semiconductor substrate that has a source, a drain, and a gate, wherein the gate has a gate oxide layer; and forming a bipolar junction transistor on the semiconductor substrate that has an emitter, a collector, and a base with a lightly-doped base region in the semiconductor substrate and a heavily-doped epitaxial semiconductor base conductor on top of the base region, wherein none of the gate oxide layer lies between the heavily-doped semiconductor base conductor and the lightly-doped base region.

17. The method defined in claim 16 wherein forming the bipolar junction transistor comprises growing an epitaxial semiconductor layer from which the heavily-doped epitaxial semiconductor base conductor and portions of the source and drain are formed.

18. The method defined in claim 16 further comprising:

forming a patterned base masking layer on the substrate; and using the base masking layer as an ion implantation mask during ion implantation into the substrate, so that the base masking layer prevents ion implantation into the lightly-doped base region.

* * * * *